United States Patent
Kumar et al.

(10) Patent No.: US 10,547,325 B2
(45) Date of Patent: Jan. 28, 2020

(54) AREA EFFICIENT DECOMPRESSION ACCELERATION

(71) Applicant: Intel Corporation, Santa Clara, CA (US)

(72) Inventors: Smita Kumar, Chandler, AZ (US); Sudhir Satpathy, Hillsboro, OR (US); Chris Cunningham, Chandler, AZ (US)

(73) Assignee: Intel Corporation Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/998,803

(22) Filed: Aug. 16, 2018

(65) Prior Publication Data

US 2019/0044534 A1 Feb. 7, 2019

(51) Int. Cl.
| | |
|---|---|
| *H03M 7/34* | (2006.01) |
| *H03M 7/40* | (2006.01) |
| *G06F 3/06* | (2006.01) |
| *H03M 7/30* | (2006.01) |
| H03M 5/02 | (2006.01) |
| H03M 13/21 | (2006.01) |
| G06F 5/00 | (2006.01) |
| H03M 7/00 | (2006.01) |
| H03M 5/14 | (2006.01) |

(52) U.S. Cl.
CPC ............ *H03M 7/40* (2013.01); *G06F 3/0608* (2013.01); *G06F 3/0631* (2013.01); *G06F 3/0673* (2013.01); *H03M 7/3086* (2013.01); *G06F 5/00* (2013.01); *H03M 5/02* (2013.01); *H03M 5/145* (2013.01); *H03M 7/00* (2013.01); *H03M 7/30* (2013.01); *H03M 13/21* (2013.01)

(58) Field of Classification Search
CPC ............ H03M 7/00; H03M 5/02; H03M 7/30; H03M 13/21; H03M 5/145; G06F 5/00
USPC .................... 341/51, 52, 55, 87, 106, 94, 95
See application file for complete search history.

(56) References Cited

U.S. PATENT DOCUMENTS

| | | | | |
|---|---|---|---|---|
| 6,130,631 | A | * 10/2000 | Redford | .................... G06T 9/00 341/67 |
| 9,697,899 | B1 | 7/2017 | Mosur et al. | |
| 9,825,647 | B1 | * 11/2017 | Satpathy | ............. H03M 7/3053 |
| 2003/0048673 | A1 | * 3/2003 | Naso | ...................... G11C 29/14 365/200 |
| 2003/0106014 | A1 | * 6/2003 | Dohmen | ........... H03M 13/1535 714/785 |

* cited by examiner

*Primary Examiner* — Joseph J Lauture
(74) *Attorney, Agent, or Firm* — Jordan IP Law, LLC

(57) ABSTRACT

An embodiment of a semiconductor package apparatus may include technology to load compressed symbols in a data stream into a first content accessible memory, break a serial dependency of the compressed symbols in the compressed data stream, and decode more than one symbol per clock. Other embodiments are disclosed and claimed.

25 Claims, 12 Drawing Sheets

AREA EFFICIENT DECOMPRESSION ACCELERATION

TECHNICAL FIELD

Embodiments generally relate to decompression. More particularly, embodiments relate to area efficient decompression acceleration.

BACKGROUND

Compression and decompression technology may be employed in a variety of applications. For example, INTEL QUICKASSIST TECHNOLOGY (QAT) accelerates and compresses cryptographic workloads by offloading the data to hardware capable of optimizing those functions. With respect to compression and decompression technology, DEFLATE may refer to a lossless data compression technique and associated file format that uses a combination of the LZ77 algorithm and Huffman coding.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Figure 1:
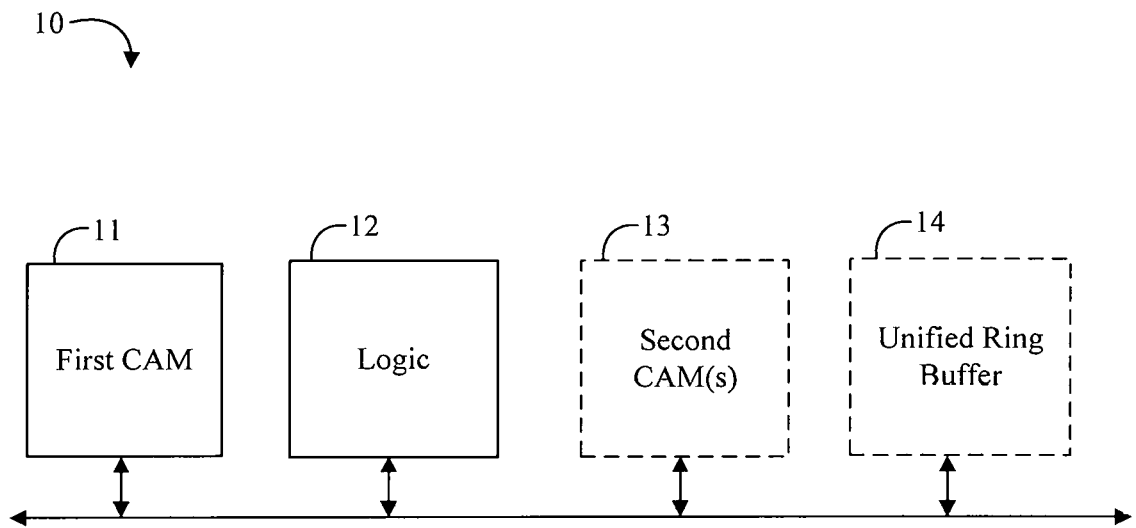
FIG. 1 is a block diagram of an example of an electronic decompression system according to an embodiment.

Turning now to FIG. 1, an embodiment of an electronic decompression system 10 may include a first content accessible memory (CAM) 11, and logic 12 communicatively coupled to the first CAM 11 to load compressed symbols in a data stream into the first CAM 11, break a serial dependency of the compressed symbols in the compressed data stream, and decode more than one symbol per clock. In some embodiments, the logic 12 to break the serial dependency of compressed symbols in the compressed data stream may be based on Huffman speculation. For example, CAM may refer to memory which is useful for very-high-speed searching applications. CAM may also be referred to as associative memory, associative storage, or an associative array (e.g., in some software implementations). Some CAM technology may compare input search data (e.g., a tag or symbol) against a table of stored data and return the address of matching data (e.g., and/or the matching data).

Some embodiments of the system 10 may optionally further include one or more second CAMs 13 communicatively coupled to the logic 12, where a capacity of each of the one or more second CAMs 13 may be less than a capacity of the first CAM 11 (e.g., miniCAMs as discussed in more detail herein). For example, the logic 12 may be further configured to load a subset of the compressed symbols into the one or more second CAMs 13, and decode the subset of the compressed symbols loaded into the one or more second CAMs 13 in parallel with the compressed symbols loaded into the first CAM 11. For example, the subset of the compressed symbols loaded into the one or more second CAMs 13 may consist of a subset of the compressed symbols loaded into the first CAM 11 having shorter length as compared to other compressed symbols loaded into the first CAM 11 (e.g., shorter code lengths).

In some embodiments of the system 10, the logic 12 may be further configured to dynamically partition the one or more second CAMs 13 based on a Huffman code distribution of corresponding literal-length and distance symbols. For example, the logic 12 may be configured to parse Huffman code-lengths for all literal, length and distance symbols in a block from a header of the block, determine minimum and maximum numbers of bits that a Huffman decoder may consume in a clock cycle based on the parsed Huffman code-lengths, and reconfigure one or more payload-shift magnitudes for the one or more second CAMs 13 based on the determined minimum and maximum numbers of bits. In some embodiments, the logic 12 may also be configured to track convergence of real and speculative threads, and generate one of a commit symbol and a flush symbol based on the tracked convergence. For example, some embodiments of the system 10 may optionally further include a unified ring buffer 14 communicatively coupled to the logic 12 to self-synchronize contents with a pair of write pointers (e.g., as described in further detail herein). In some embodiments, the logic 12 may be further configured to evaluate consecutive reference tokens to opportunistically select reference pairs that can be simultaneously written into a history buffer without any internal data dependency. In some embodiments, the first CAM 11, the logic 12, the second CAMs 13 and/or the unified ring buffer 14 may be located in, or co-located with, various components, including a processor, controller, micro-controller, sequencer, etc. (e.g., on a same die).

Embodiments of each of the above first CAM 11, logic 12, second CAMs 13, unified ring buffer 14, and other system components may be implemented in hardware, software, or any suitable combination thereof. For example, hardware implementations may include configurable logic such as, for example, programmable logic arrays (PLAs), field programmable gate arrays (FPGAs), complex programmable logic devices (CPLDs), or fixed-functionality logic hardware using circuit technology such as, for example, application specific integrated circuit (ASIC), complementary metal oxide semiconductor (CMOS) or transistor-transistor logic (TTL) technology, or any combination thereof. Where the logic is implemented by or integrated with a processor, embodiments of the processor may include a general purpose processor, a special purpose processor, a central processor unit (CPU), a controller, a micro-controller, etc.

Alternatively, or additionally, all or portions of these components may be implemented in one or more modules as a set of logic instructions stored in a machine- or computer-readable storage medium such as random access memory (RAM), read only memory (ROM), programmable ROM (PROM), firmware, flash memory, etc., to be executed by a processor or computing device. For example, computer program code to carry out the operations of the components may be written in any combination of one or more operating system (OS) applicable/appropriate programming languages, including an object-oriented programming language such as PYTHON, PERL, JAVA, SMALLTALK, C++, C # or the like and conventional procedural programming languages, such as the "C" programming language or similar programming languages. For example, persistent storage media or other system memory may store a set of instructions which, when executed by a processor, cause the system 10 to implement one or more components, features, or aspects of the system 10 (e.g., the logic 12, loading the compressed symbols into the CAM(s), breaking the serial dependency of the compressed symbols in the compressed data stream, decoding more than one symbol per clock, etc.).

Figure 2:
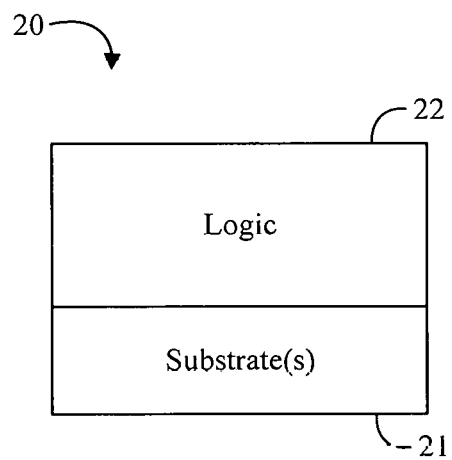
FIG. 2 is a block diagram of an example of a semiconductor package apparatus according to an embodiment.

Turning now to FIG. 2, an embodiment of a semiconductor package apparatus 20 may include one or more substrates 21, and logic 22 coupled to the one or more substrates 21, wherein the logic 22 is at least partly implemented in one or more of configurable logic and fixed-functionality hardware logic. The logic 22 coupled to the uue or more substrates 21 may be configured to load compressed symbols in a data stream into a first CAM, break a serial dependency of the compressed symbols in the compressed data stream, and decode more than one symbol per clock. For example, the logic 22 to break the serial dependency of compressed symbols in the compressed data stream may be based on Huffman speculation.

In some embodiments of the apparatus 20, the logic 22 may be further configured to load a subset of the compressed symbols into one or more second CAMs (e.g., miniCAMs), wherein the subset of the compressed symbols loaded into the one or more second CAMs may consist of a subset of the compressed symbols loaded into the first CAM having shorter length as compared to other compressed symbols loaded into the first CAM, and decode the subset of the compressed symbols loaded into the one or more second CAMs in parallel with the compressed symbols loaded into the first CAM.

In some embodiments of the apparatus, the logic 22 may be additionally or alternatively configured to dynamically partition the one or more second CAMs based on a Huffman code distribution of corresponding literal-length and distance symbols. For example, the logic 22 may be configured to parse Huffman code-lengths for all literal, length and distance symbols in a block from a header of the block, determine minimum and maximum numbers of bits that a Huffman decoder may consume in a clock cycle based on the parsed Huffman code-lengths, and reconfigure one or more payload-shift magnitudes for the one or more second CAMs based on the determined minimum and maximum numbers of bits. In some embodiments, the logic 22 may also be configured to track convergence of real and speculative threads, and generate one of a commit symbol and a flush symbol based on the tracked convergence. The logic 22 may also be configured to evaluate consecutive reference tokens to opportunistically select reference pairs that can be simultaneously written into a history buffer without any internal data dependency. In some embodiments, the logic 22 coupled to the one or more substrates 21 may include transistor channel regions that are positioned within the one or more substrates 21.

Embodiments of logic 22, and other components of the apparatus 20, may be implemented in hardware, software, or any combination thereof including at least a partial implementation in hardware. For example, hardware implementations may include configurable logic such as, for example, PLAs, FPGAs, CPLDs, or fixed-functionality logic hardware using circuit technology such as, for example, ASIC, CMOS, or TTL technology, or any combination thereof. Additionally, portions of these components may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C # or the like and conventional procedural programming languages, such as the "C" programming language or similar programming languages.

The apparatus 20 may implement one or more aspects of the method 30 (FIGS. 3A to 3C), or any of the embodiments discussed herein. In some embodiments, the illustrated apparatus 20 may include the one or more substrates 21 (e.g., silicon, sapphire, gallium arsenide) and the logic 22 (e.g., transistor array and other integrated circuit/IC components) coupled to the substrate(s) 21. The logic 22 may be implemented at least partly in configurable logic or fixed-functionality logic hardware. In one example, the logic 22 may include transistor channel regions that are positioned (e.g., embedded) within the substrate(s) 21. Thus, the interface between the logic 22 and the substrate(s) 21 may not be an abrupt junction. The logic 22 may also be considered to include an epitaxial layer that is grown on an initial wafer of the substrate(s) 21.

Figure 3A:
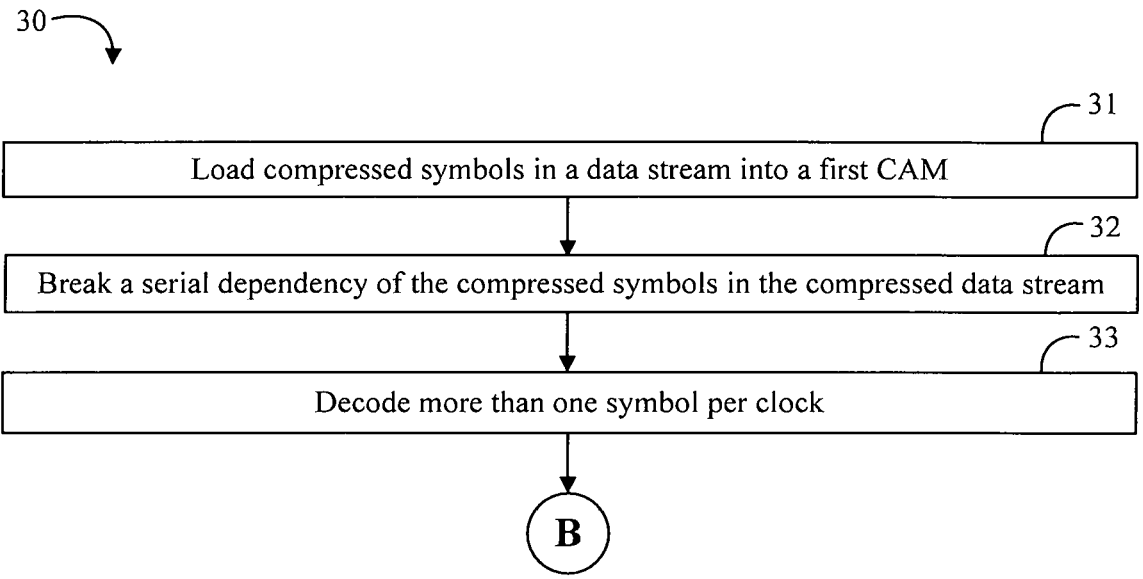
FIGS. 3A to 3C are flowcharts of an example of a method of decompressing data according to an embodiment.
Figure 3B:
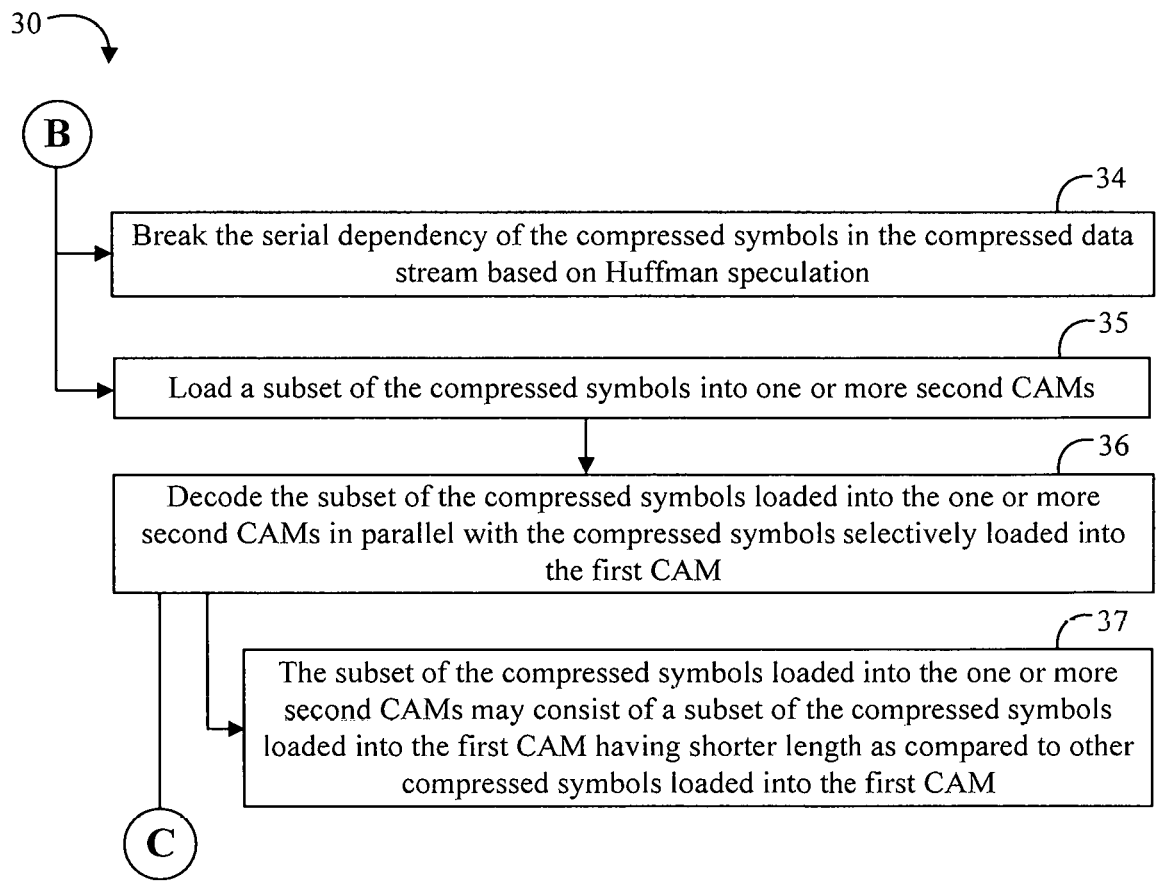
Figure 3C:
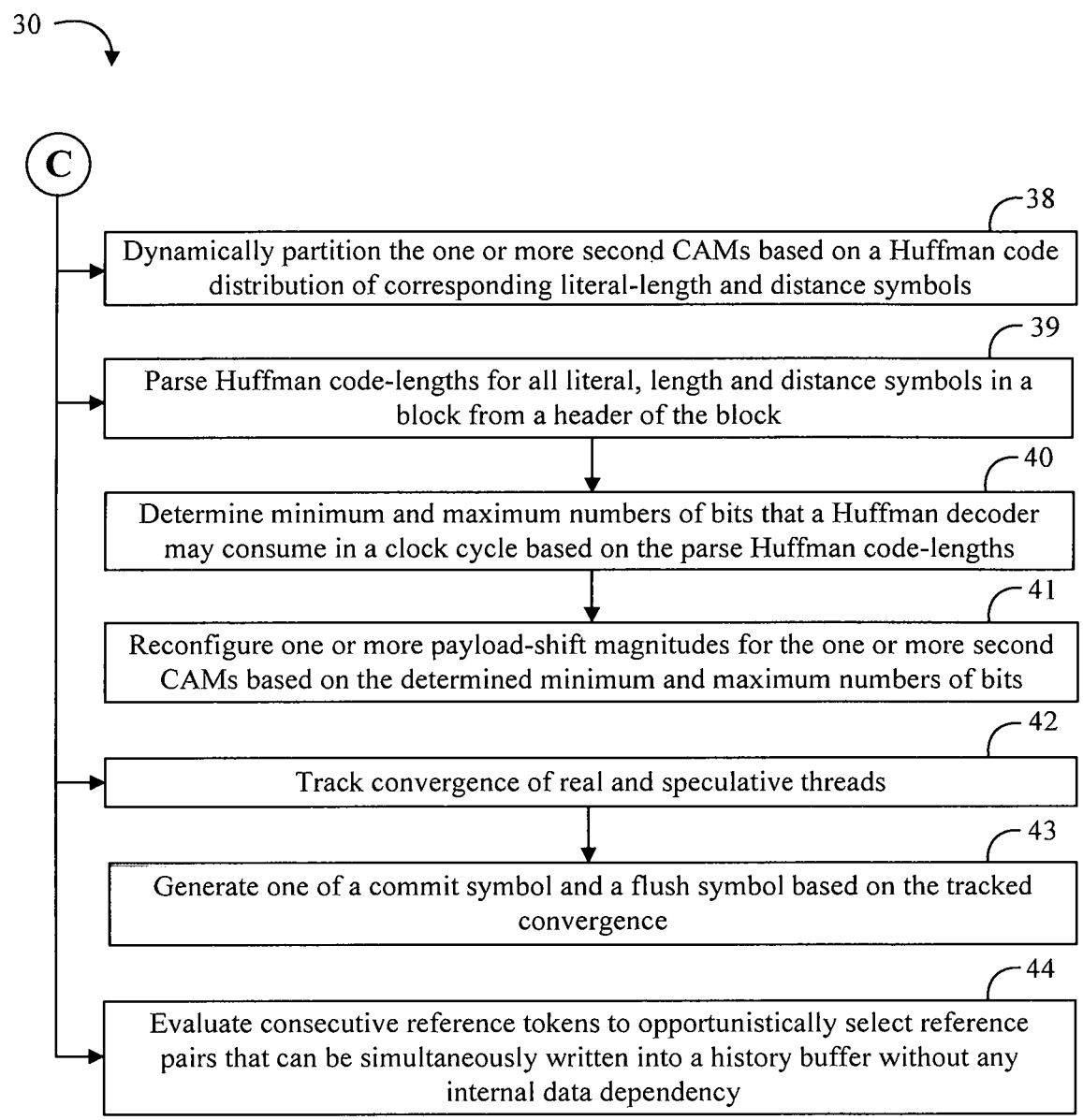

Turning now to FIGS. 3A to 3C, an embodiment of a method 30 of decompressing data may include loading compressed symbols in a data stream into a first CAM at block 31, breaking a serial dependency of the compressed symbols in the compressed data stream at block 32, and decoding more than one symbol per clock at block 33. For example, the method 30 may include breaking the serial dependency of the compressed symbols in the compressed data stream based on Huffman speculation at block 34. Some embodiments of the method 30 may additionally or alternatively include loading a subset of the compressed symbols into one or more second CAMs at block 35, and decoding the subset of the compressed symbols loaded into the one or more second CAMs in parallel with the compressed symbols loaded into the first CAM at block 36. For example, the subset of the compressed symbols loaded into the one or more second CAMs may consist of a subset of the compressed symbols loaded into the first CAM having shorter length as compared to other compressed symbols loaded into the first CAM at block 37.

Some embodiments of the method 30 may further include dynamically partitioning the one or more second CAMs based on a Huffman code distribution of corresponding literal-length and distance symbols at block 38. For example, the method 30 may include parsing Huffman code-lengths for all literal, length and distance symbols in a block from a header of the block at block 39, determining minimum and maximum numbers of bits that a Huffman decoder may consume in a clock cycle based on the parsed Huffman code-lengths at block 40, and reconfiguring one or more payload-shift magnitudes for the one or more second CAMs based on the determined minimum and maximum numbers of bits at block 41. Some embodiments of the method 30 may also include tracking convergence of real and speculative threads at block 42, and generating one of a commit symbol and a flush symbol based on the tracked convergence at block 43. The method 30 may also include evaluating consecutive reference tokens to opportunistically select reference pairs that can be simultaneously written into a history buffer without any internal data dependency at block 44.

Embodiments of the method 30 may be implemented in a system, apparatus, computer, device, etc., for example, such as those described herein. More particularly, hardware implementations of the method 30 may include configurable logic such as, for example, PLAs, FPGAs, CPLDs, or in fixed-functionality logic hardware using circuit technology such as, for example, ASIC, CMOS, or TTL technology, or any combination thereof. Alternatively, or additionally, the method 30 may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C # or the like and conventional procedural programming languages, such as the "C" programming language or similar programming languages.

For example, the method 30 may be implemented on a computer readable medium as described in connection with Examples 26 to 33 below. Embodiments or portions of the method 30 may be implemented in firmware, applications (e.g., through an application programming interface (API)), or driver software running on an operating system (OS). Additionally, logic instructions might include assembler instructions, instruction set architecture (ISA) instructions, machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, etc.).

MINICAM Examples

Some embodiments may advantageously provide multiple miniCAMs for enhancement of dynamic DEFLATE decompression throughput. A CAM may be designed to search its entire memory in a single operation, and accordingly may be much faster than RAM for some decompression applications. CAM may be more costly than RAM, however, because in some implementations each individual memory bit in a fully parallel CAM may have its own associated comparison circuit to detect a match between the stored bit and the input bit. Additionally, match outputs from each cell in the data word may be combined to yield a complete data word match signal. The additional circuitry increases the physical size and manufacturing cost of the CAM component. The extra circuitry may also increase power dissipation because every comparison circuit may be active on every clock cycle.

For some decompression applications, after decoding the dynamic DEFLATE header, the codes for two hundred eighty-six (286) literal/length symbols and thirty (30) distance symbols may be placed in a CAM. The input stream may be provided to the CAM twenty-eight (28) bits at a time. A CAM hit with a match length M may result in M bits being stripped from the input and the shifted input may be provided to the CAM in the next clock, to decode the next symbol. For some decode engines, the maximum achievable throughput may be one symbol per clock. Some other decoders may decode multiple symbols per clock by duplicating the entire CAM multiple times and have the multiple CAMs working in parallel on 28 bits of the input stream offset by a bit from each other. For some decode engines, the CAM may account for about eight five percent (85%) of the DEFLATE decode engine area. Duplicating the entire CAM multiple times results in a significant increase in area and/or power consumption. Also, it may be difficult or impossible to converge on timing at high speed (e.g., 1 GHz or more) utilizing multiple full-size CAMs offset by a bit.

Some embodiments may advantageously provide an area efficient, high throughput single-stream DEFLATE decompression engine that can match or exceed the DEFLATE compression engine's performance, for efficient chaining in compress and verify applications. Dynamic DEFLATE decompression may be highly serial in nature due to the variable length of the codes. Some embodiments may advantageously match more than one symbol per clock in the CAM(s) to decode more than one symbol per clock (e.g., more than one literal, length or distance per clock). Some embodiments may enable opportunistic decode of two symbols per clock.

Without being limited to theory of operation, a basic principle of Huffman encoding is that the more frequently occurring symbols get the shortest code lengths. For example, a main CAM may store codes for 286 literal/length symbols and 30 distance symbols. Some embodiments may advantageously store codes for a subset of these symbols in a miniCAM, which may correspond to a CAM which has less storage capacity as compared to the main CAM (e.g., a smaller CAM to store a reduced amount of content). For example, the 8 shortest length/literal codes may be loaded into smaller length/literal-CAMs (miniLCAMs) and the 8 shortest distance codes may be loaded into smaller distance-CAMs (miniDCAMs). Advantageously, only the more frequently accessed data in the main CAM is duplicated in the miniCAMs. In some embodiments, the miniCAMs may be duplicated multiple times and work in parallel with the main CAMs. The main CAM may decode one symbol per clock (e.g., literal, length or distance). Advantageously, the miniCAMs may opportunistically decode two symbols per clock and provide a throughput boost. Because the miniCAMs are only 8-deep, the throughput boost comes at a relatively low cost in terms of silicon area and power consumption (e.g., as compared to multiple full-size CAMs).

During the DYNAMIC DEFLATE header decode, after the codelengths for the 316 deflate symbols are determined (286 literal/length plus 30 distance), the number of occurrences of each code length may be counted to generate the first codes. During this stage, the code lengths of the 8 shortest literal codes and the 8 shortest distance codes may be determined. As the symbol codes are loaded into the main CAM (consisting of 286 length/literal symbol CAMs (LCAMs) and 30 distance symbol CAMs (DCAMs)), the 8 most frequently occurring (shortest) literal/length codes may be loaded into the miniLCAM's and the 8 most frequently occurring (shortest) distance codes may be loaded into the miniDCAM's. Some embodiments may limit the maximum length of the code that can be loaded into the miniCAM's to 8 to enable better timing convergence (e.g., as opposed to a maximum length of 15 in the main CAMs).

For some compressed data streams, a literal symbol can be followed by a literal or length symbol; a length symbol can be followed by a distance symbol; and a distance symbol can be followed by a literal or length symbol. Advantageously, some embodiments may configure the miniCAMs to decode in a clock: 1) two frequently occurring literal symbols; a frequently occurring length symbol and a frequently occurring distance symbol; a frequently occurring literal symbol and a frequently occurring length symbol; or a frequently occurring distance symbol and a frequently occurring literal/length symbol.

Figure 4:
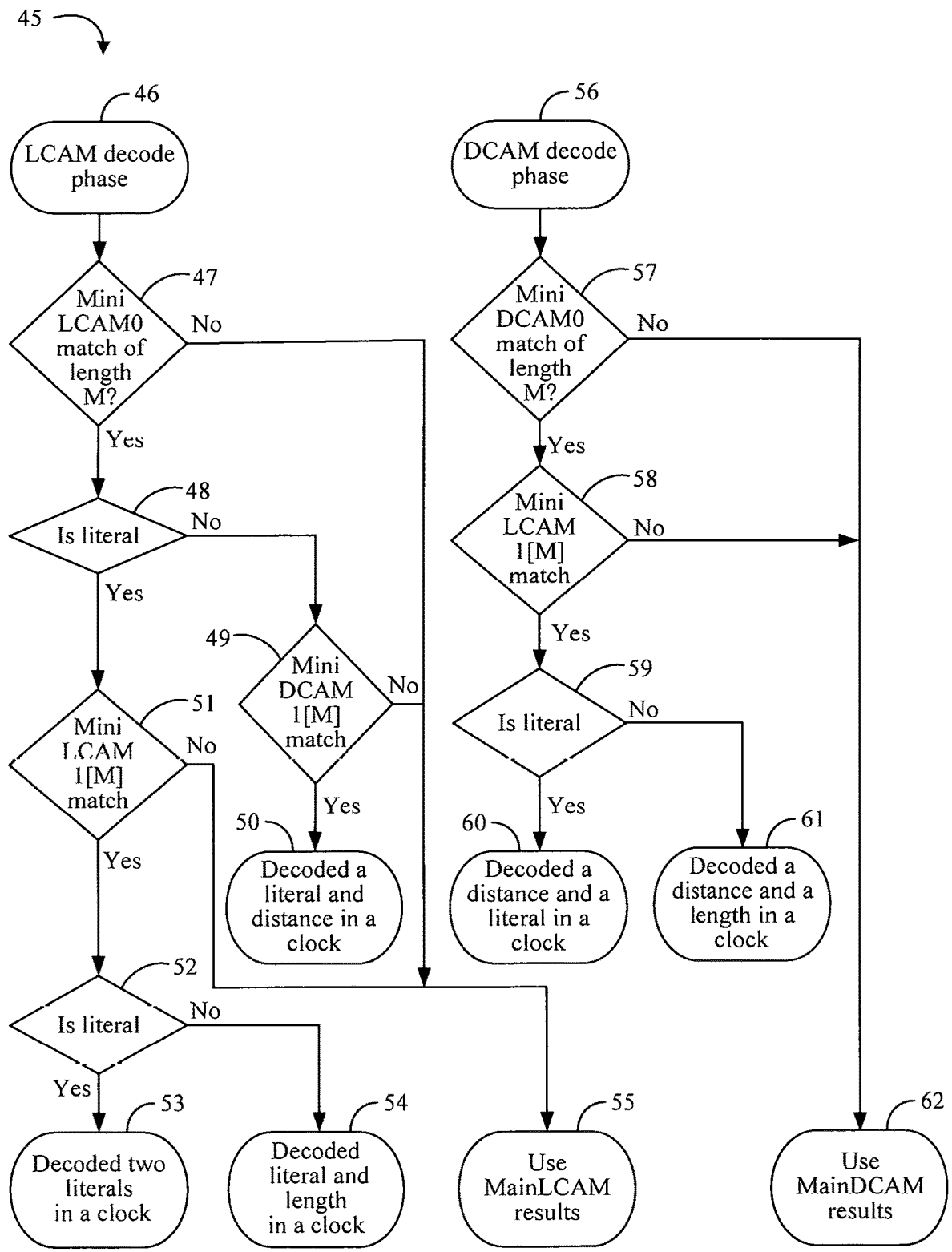
FIG. 4 is a flowchart of an example of a method of decoding according to an embodiment.

Turning now to FIG. 4, a method 45 of decoding may include a LCAM decode phase 46 and a DCAM decode phase 56 (e.g., which may run in parallel with each other and/or a main CAM decode phase). The method 45 may include determining if miniLCAM0 matches a length M at block 47. If not, the method 45 may include using the main LCAM results at block 55. Otherwise, the method 45 may include determining if the symbol is a literal at block 48. If not, the method 45 may include determining if miniDCAM1 [M] matches at block 49 and, if so, the method 45 may have decoded a literal and a distance in a single clock at block 50 (otherwise, the method 45 may proceed to using the main LCAM results at block 55). If the symbol is determined to be a literal at block 48, the method 45 may proceed to determining if miniLCAM1[M] matches at block 51 and, if not, using the main LCAM results at block 55. Otherwise, the method 45 may proceed to determining if the matching symbol is a literal at block 52. If so, the method 45 may have decoded two literals in a cluck at block 53. Otherwise, the method 45 may have decoded a literal and a length symbol in a clock at block 54.

For the DCAM phase 56, the method 45 may include determining if miniDCAM0 matches a length M at block 57. If not, the method 45 may include using the main DCAM results at block 62. Otherwise the method 45 may include determining if miniLCAM1[M] matches at block 51 and, if not, using the main DCAM results at block 62. Otherwise, the method 45 may proceed to determining if the matching symbol is a literal at block 59. If so, the method 45 may have decoded a distance and a literal in a clock at block 60. Otherwise, the method 45 may have decoded a distance and a length in a clock at block 61. Advantageously, the miniCAMs may operate in conjunction with the main CAMs to improve DYNAMIC DEFLATE decompression throughput.

Figure 5:
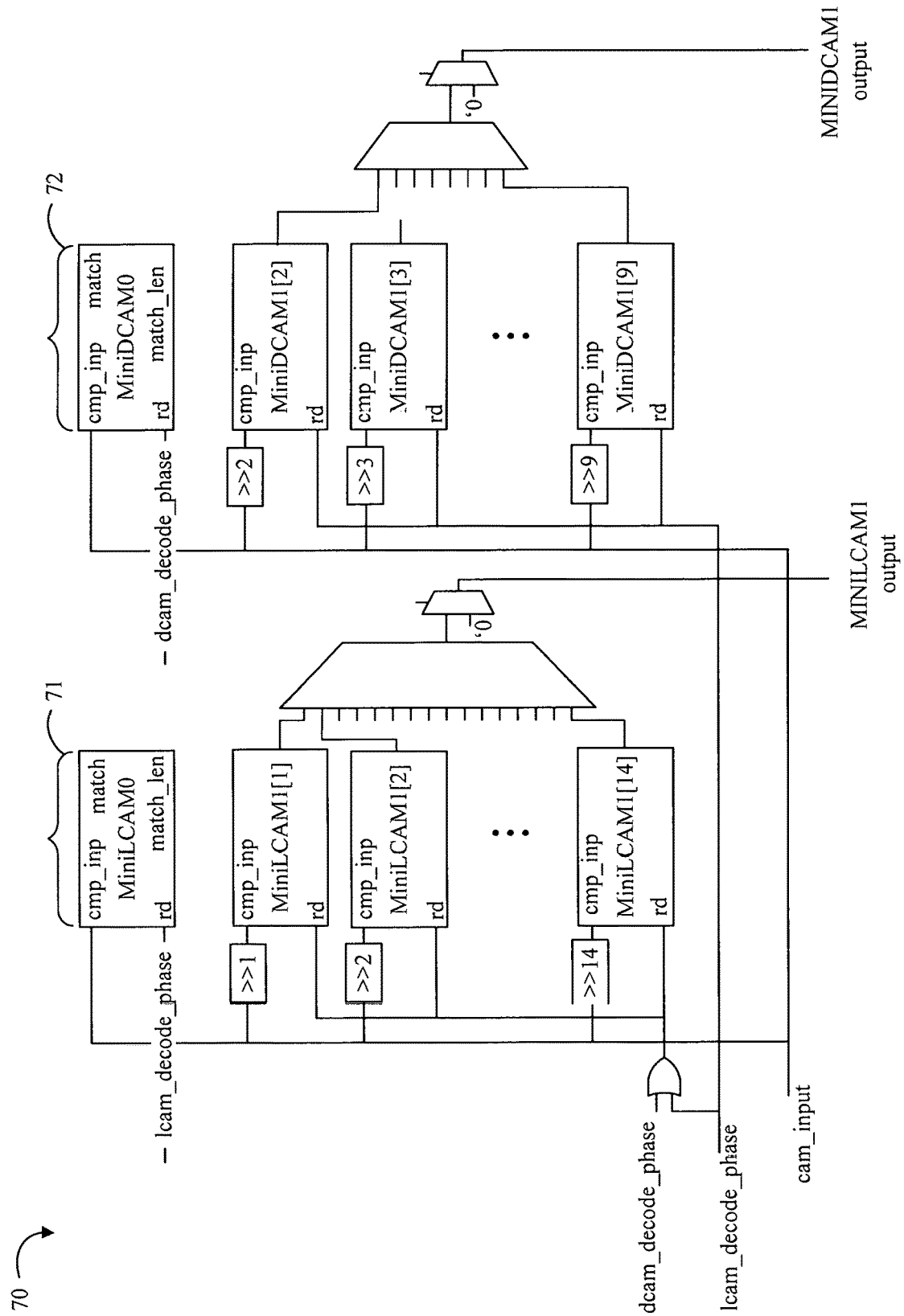
FIG. 5 is a block diagram of an example of decoder apparatus according to an embodiment.

Turning now to FIG. 5, an embodiment of a decoder apparatus 70 may include a plurality of miniCAMs including one or more miniLCAMs 71 and one or more miniDCAMs 72. The miniLCAMs 71 may include MiniLCAM0 and MiniLCAM1[1] through MiniLCAM[14]. The miniDCAMs 72 may include MiniDCAM0 and MiniDCAM1[2] through MiniDCAM[9]. In some embodiments, the MiniLCAM0/MiniDCAM0 assembly may be used for the first symbol lookup. In parallel, 15 miniLCAM1 and 13 miniDCAM1 assemblies may attempt to perform a second symbol lookup. MiniLD-CAM1[M] may operate on an M-bit right shifted version of MiniLD-CAM0's input. In the LCAM decode phase, the MainLCAM, MiniLCAM0, MiniLCAM1 [M] and MiniDCAM1[M] may be active. In the DCAM decode phase, the MainDCAM, MiniDCAM0 and MiniLCAM1[M] may be active.

If there is a hit in the miniLCAM0 for a "literal", with match length M and there is a hit in MiniLCAM1[M], two literals or a literal/length may be decoded in a clock. Similarly, if there is a hit in the miniLCAM0 for a "length" with match length M and there is a hit in MiniDCAM1[M], a length and distance symbol may be decoded in a clock. If there is a hit in miniDCAM0 for a distance with match length M followed by a hit in miniLCAM1[M], a distance and a literal/length symbol may be decoded in a clock.

In some DEFLATE compressed files, a file that has Huffman codes of bit length of 1 may be highly compressible and accordingly may be decompressed faster. In order to improve or optimize die area with minimal loss in throughput, the MiniLD-CAM1 assembly may be dropped in some implementations.

In some embodiments, the miniLCAMs may work on 13 bits (8 bit code+5 extra bits) of the input stream offset by a bit from each other. The miniDCAMs may work on 21 bits (8 bit code+13 extra bits) of the input stream offset by a bit from each other. The miniLCAMs may be duplicated 15 times, while the miniDCAM's may be duplicated 8 times.

For 8K segments of the CALGARY CORPUS compressed files that have a compression ratio greater than 0.3, some embodiments may improve symbol decode throughput to 1.25 symbols/clock from 1 symbol/clock corresponding to a 25% increase in throughput. The overall performance gain across all 8K segments (e.g., including the heavily compressible files) of the CALGARY CORPUS may be about 20%.

Speculative Decompression Examples

Some embodiments may advantageously provide area-efficient speculative decompression for DEFLATE acceleration for a packet processing accelerator (e.g., such as INTEL QAT). Data decompression may be challenging to accelerate because of the serial nature of Huffman symbols comprising a compressed payload. Some electronic processing systems may include packet processing accelerator technology. For example, QAT may be included in servers, networking SoCs, special purpose ASICs (e.g., integrated via PCIe), etc., to enable real time data compression/decompression at throughput exceeding 100 Gb/s. Packet processing accelerators may benefit from improvement in DEFLATE decompression performance (e.g., to bridge the gap between compression (50 Gb/s) and decompression (20 Gb/s) throughput). Some systems may address this performance deficiency by replicating multiple decompression accelerator slices that process parallel workloads. However, this approach may limit single thread performance and/or results in larger die area/cost (e.g., because of inclusion of additional decode logic and history buffers for every decompressor accelerator slice). Some embodiments may provide area efficient technology to improve decompression performance. For example, some embodiments may provide several alternative techniques to accelerate decompression using speculative decode.

For some decompression applications, each DEFLATE compressed file may require access to its most recently decompressed 32 KB history, and separate CAMs to store Huffman trees for their corresponding streams. Accordingly, systems that use multiple engines or additional CAMs incur very large area overhead because of additional logic as well as 32 KB register file arrays, resulting in larger die area/cost. Some embodiments may utilize Huffman speculation that breaks the serial dependency of compressed symbols in a DEFLATE stream, thereby providing opportunity to improve Huffman decode throughput by up to two times (2×) without requiring any additional CAM or history buffer. Elimination of this serial bottleneck improves single thread performance that may advantageously be leveraged to achieve target throughput with a fewer number of accelerator slices.

In some embodiments, the Huffman code-lengths for all literal, length and distance symbols participating in a block may be parsed from the block header to determine the minimum and maximum number of bits that the Huffman decoder can consume in a clock cycle. Some embodiments may use this information to reconfigure the payload-shift magnitudes for miniCAMs before processing a block, eliminating wasteful decode attempts and improving performance while fine-tuning the miniCAM operation for each new block.

Instead of using separate additional helper CAM banks for literal-length and distance decode (e.g., such as the miniCAMs described in connection with FIGS. 4 and 5), some embodiments may provide reconfigurable CAMs that can be partitioned on-the-fly in accordance to the Huffman code distribution of corresponding literal-length and distance symbols in every block. Such reconfigurable CAMs may advantageously allow more efficient usage of CAM resources, and may save area by enabling equivalent performance improvement with fewer CAM arrays.

In addition to generating literal-length and distance symbols, some embodiments of a Huffman decoder may track convergence of real and speculative threads and appropriately generate commit or flush symbols. The generated commit/flush symbols may provide synchronization boundaries to enable seamless merging of real and speculative tokens in downstream logic. Advantageously, some embodiments may significantly simplify hardware implementation.

Instead of storing decoded literal and reference-tokens for real and speculative threads in separate queues, some embodiments may utilize a unified ring buffer that self-synchronizes contents using a pair of write pointers. The ring buffer may be written to from opposite ends with literals and tokens with appropriate control flow tags that accurately chain the symbols for clear-text (LZ77) construction while eliminating the need for any additional synchronization logic. Some embodiments may advantageously reduce the fill-buffer size by 50% to accommodate similar number of symbols (e.g., as compared to systems that use separate queues for symbol storage).

The ability to process two reference tokens during LZ77 reconstruction may be needed to generate two Huffman symbols per clock cycle, for stall-free operation. Some embodiments may evaluate consecutive reference tokens to opportunistically select reference pairs that can be simultaneously written into the history buffer without any internal data dependency. In accordance with some embodiments, such reference conflict aware LZ77 processing may allow faster clear-text construction and enable higher performance and usage of smaller queues to store intermediate reference tokens.

Figure 6:
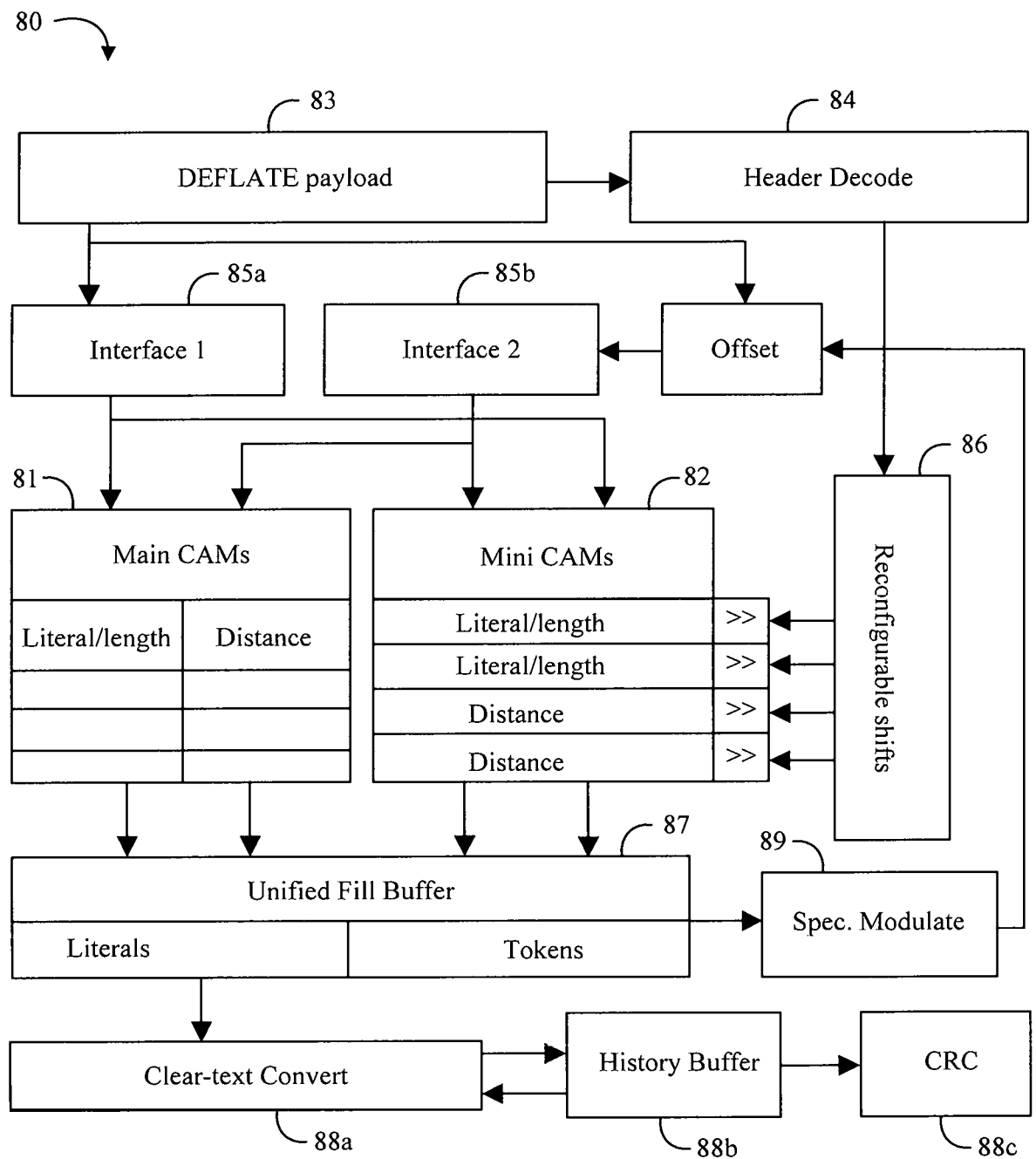
FIG. 6 is a block diagram of an example of a decompression apparatus according to an embodiment.

Turning now to FIG. 6, an embodiment of a decompression apparatus 80 may include one or more main CAMs 81 and one or more miniCAMs 82. A DEFLATE payload block 83 may provide a buffer for the incoming compressed DEFLATE payload. The block 83 may include two read ports for the read and speculative threads. A header decode block 84 may perform the dynamic deflate (e.g., Huffman) header decode and the decode results may be loaded into the Main CAMs 81 and the miniCAMs 82. The Interface 1/Interface 2 blocks 85a and 85b may correspond to the two threads (real and speculative). Data may be read from the DEFLATE payload buffer 83 and presented to the CAMs 81 and 82 for lookup. The Main CAMs 81 may stores the codes for the 286 literal/length symbols and 30 distance symbols. The MiniCAMs 82 may store the codes for the 8 most frequently occurring length/literal symbols and 8 most frequent distance symbols. The reconfigurable shifts block 86 may selectively load codes into the miniCAMs 82 based on the header decode. The unified fill buffer 87 may include logic that stores decoded symbols corresponding to the real and speculative threads. The buffer 87 may also stores the COMMIT command to enable switching between the two threads. The clear-text converter 88a may convert the LZ77 stream to cleartext by issuing read/write commands to the history buffer 88b. The speculative (spec.) modulate block 89 may include control logic to control switching of the threads on a COMMIT and starting a new speculation on a FLUSH. The history buffer 88b may include a 32 kB buffer to store the decompressed cleartext, and the cyclic redundancy check(CRC) block 88c may include logic used for data integrity checks.

In some embodiments (e.g., similar to as discussed in connection with FIGS. 4 and 5 above), a DEFLATE decompression accelerator data path may be utilized with QAT, where the accelerator is organized around a single Huffman decoder. The Huffman decoder may store pre-computed literal, length, and distance symbols in a main CAM that guarantees decode completion of one symbol in a cycle. A bank of miniCAMs may process shifted versions of the payload to enable opportunistic decode of an additional symbol in situations where the total length of the first symbol (e.g., the sum of Huffman code length and extra bits) is less than the maximum payload shift magnitude. With this technology, the possibility of decoding two consecutive symbols may depend on the nature of compressed payload as well as the selection of symbols that are stored in the miniCAMs.

Some embodiments of the apparatus 80 may provide an additional parallel Huffman decoder by replicating the CAM/miniCAMs read ports. The additional CAM port may be used to speculatively process an advanced payload (e.g., that starts at a pre-determined offset from the real payload), where the advanced payload's starting index may be subsequently compared against the advancing index of the real thread to identify successful convergence.

In some embodiments, discarding the first forty (40) speculative symbols improves the probability of successful convergence to 99%. Some embodiments may add an additional interface to keep track of the number of discarded symbols and to check-point the bit-index of the 41st symbol. In the event that the forty-first (41st) symbol is a distance, an additional symbol may be discarded. Some embodiments may advantageously simplify the accelerator data path by ensuring that a reference (length+distance) token can never span beyond the check-pointed boundary. In some embodiments, additional read ports in the miniCAMs may further improve Huffman decode performance by opportunistically processing an extra consecutive symbol in the real and speculative threads. An example implementation with results generated from a max_compression test suite (e.g., prog1, A10_jpg, AcroRd32, FF_log, FlashMx, MS097_DLL, English_dic, Ohs_doc, rafale, vcfiu, world95) showed an improved Huffman decoder throughput by up to two times (2×).

Figure 7A:
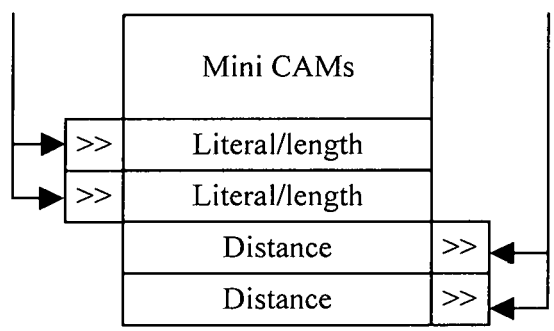
FIGS. 7A to 7B are block diagrams of an examples of miniCAMs according to respective embodiments.
Figure 7B:
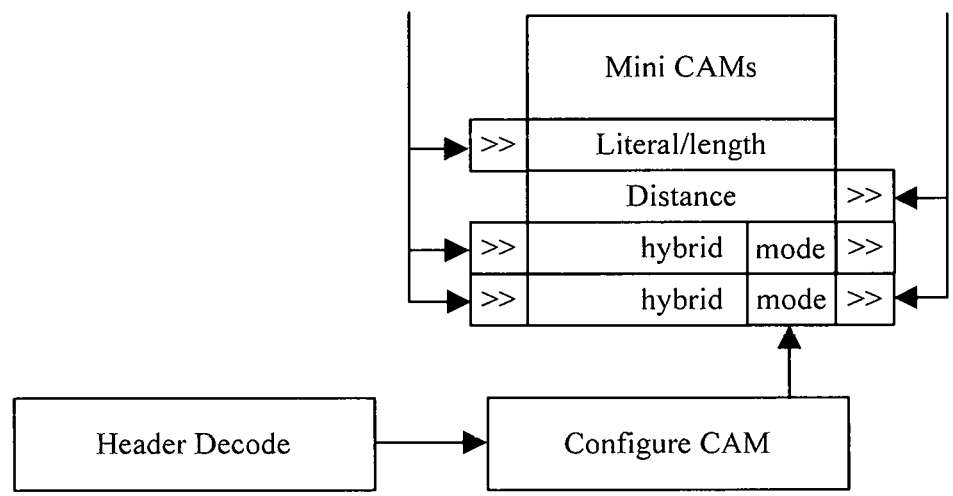

Turning now to FIGS. 7A to 7B, embodiments of respective miniCAMs 91 and 92 may each improve the performance of Huffman-based decompression. The miniCAMs 91 may operate on fixed payload offsets over a range of 1 bit to 17 bits. For some applications, most compressed files may be comprised of blocks where smaller Huffman codes (e.g., 4 bit and smaller) are rarely used, although such smaller codes have very high probability of occurrence and accordingly may be preferred over longer codes for storage in miniCAMs. Some embodiments of the miniCAMs 92 may provide reconfigurable payload shift and adaptive miniCAM partitions for further improvement of the performance of Huffman-based decompression. Some embodiments may advantageously leverage reconfigurable payload shifts that may be appropriately set for each block to reduce or eliminate miniCAM under-utilization. Prior to the decompression process, for example, the accelerator may parse every block header to determine the code-lengths of all participating symbols. Some embodiments may concurrently calculate the minimum Huffman code-length and use the calculated minimum Huffman code-length as the starting shift. Some embodiments of a reconfigurable miniCAM may reduce or eliminate wasteful miniCAM look-ups and improve decode performance by allocating redundant miniCAMs to larger shifts (e.g., 18 bits and beyond).

The number of literal-length and distance symbols comprising a DEFLATE payload can vary significantly across file types and even the compression levels used to process them. Files that are not well compressed do not tend to use most of the length and distance codes. In addition, smaller files tend to use fewer distance codes. For example, for 1 Kb files, 30% of distance codes (e.g., corresponding to range 1025-32 Kb) are not used, resulting in a smaller Huffman tree with shorter codes. Accordingly, some embodiments may provide additional performance improvement by adaptively allocating miniCAMs for literal-length or distance decode by observing code statistics in the block header. Advantageously, some embodiments may provide a bank of hybrid CAMs that may be adaptively allocated towards literal-length or distance codes based on their relative distribution in the corresponding block.

Figure 8:
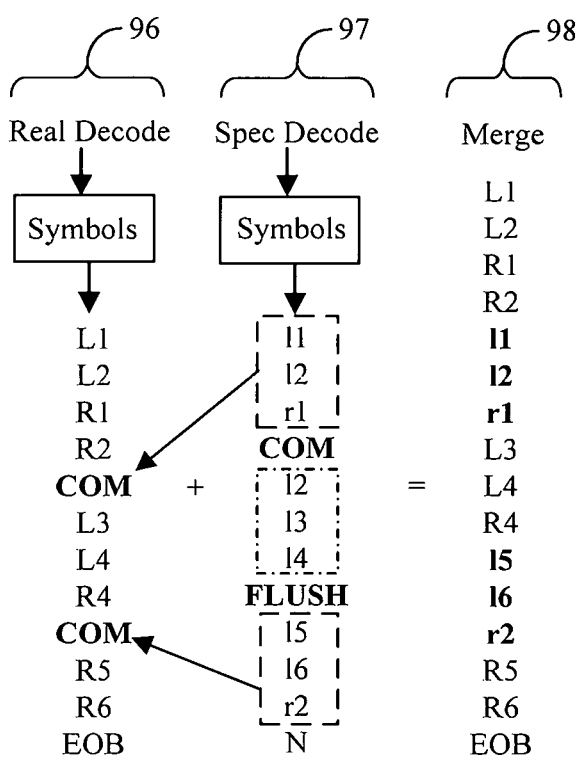
FIG. 8 is an illustrative diagram of a process flow for speculative processing according to an embodiment.

Turning now to FIG. 8, an embodiment of a process flow 95 for speculative processing may include a real decode process 96, a speculative decode process 97, and a merge process 98. For example, the decompression apparatus 80 may generate two streams of Huffman decoded symbols from the real and speculative threads respectively as shown in the illustrative example of FIG. 8. Symbols generated from the real thread may be immediately consumed by downstream units, while the speculative symbols may need to be cached and may only be used after successful convergence. In rare occasions of speculation failure, such cached symbols may be flushed out. In some embodiments, merging of real and speculative symbols may be accomplished using a pair of special flags/symbols defined as "commit" (COM) and "flush" (FLUSH). These special symbols may be inserted into the Huffman code stream at real/speculative thread boundaries, and subsequently used by downstream logic for synchronization.

Figure 9:
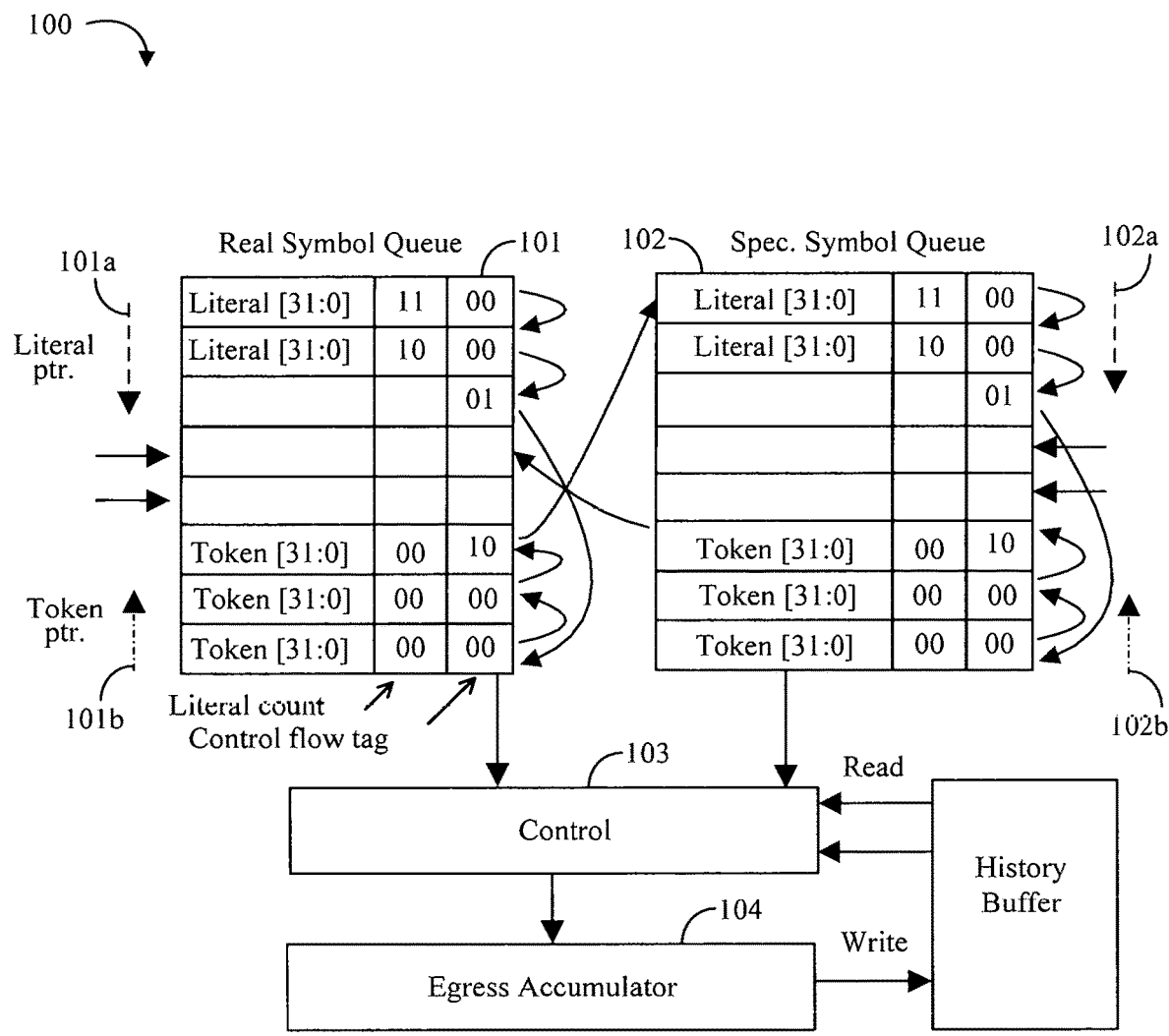
FIG. 9 is a block diagram of an example of a decompression queue processor apparatus according to an embodiment.

Turning now to FIG. 9, an embodiment of a decompression queue processor 100 may include a real symbol queue 101 and a speculative symbol queue 102, both of which may be communicatively coupled to a control module 103. The control module 103 may process the two queues based on control flow tags and provide the results to an egress accumulator 104. The egress accumulator 104 may write information to a history buffer 105. The history buffer 105 may also be communicatively coupled to the control module 103, such that the control module 103 may read information from the history buffer 105.

Huffman decoded raw literals and reference tokens may be stored in a fill buffer (e.g., the unified fill buffer as shown in FIG. 6) that comprises of a pair of queues for storing real and speculative symbols respectively (e.g., the real symbol queue 101 and the speculative symbol queue 102). Using separate queues to store literal and reference tokens may benefit from sizing both queues separately for an expected worst-case scenario to ensure stall-free operation. Some other systems may cover both extreme cases, where all symbols are literals or references respectively, which may lead to doubling the size of the queues resulting in 50% under-utilization for an average-case scenario. Some embodiments may advantageously provide a unified queue that populates literals and references from opposite extreme ends with the aid of two pointers (e.g., literal pointer 101*a* and token pointer 101*b* for the real symbol queue 101, literal pointer 102*a* and token pointer 102*b* for the speculative symbol queue 102, as shown in FIG. 9). In addition to literals, and tokens, these queues also store control flow tags that are derived from the "commit" and "flush" flags generated by upstream Huffman decoder logic during speculation convergence and failure. A speculation failure reverts the literal and token pointers back to their starting positions, while speculation convergence inserts the appropriate control tag in the real queue to chain symbols from the speculation queue. An example of how the control module 103 may utilize the control flow tags is as follows: for a control flag tag value of 00, continue to the next symbol of same type (e.g., literal to literal or token to token); for a control flag tag value of 01, switch from literal to token or token to literal in the same queue; for a control flag tag value of 10, switch to the other queue and fetch literal; and for a control flow tag value of 11, switch to the other queue and fetch token.

Some embodiments may also augment the LZ77 reconstruction logic to speed-up clear-text construction by opportunistically processing two tokens concurrently. For example, the control module 103 may simultaneously fetch a pair of consecutive tokens from the fill buffer and determines if the reference copies have no internal dependency between themselves as well as with the egress accumulator 104 (e.g., with contents that are yet to be written to the history buffer 105). Under such a conflict free scenario, the control module 103 may launch two parallel read accesses from the history buffer 105, which may make it possible to clear two tokens in a cycle. Improving LZ77 reconstruction performance may advantageously allow a decompression accelerator (e.g., QAT) to fully leverage the benefits of Huffman speculation for improving overall system throughput.

Figure 10A:
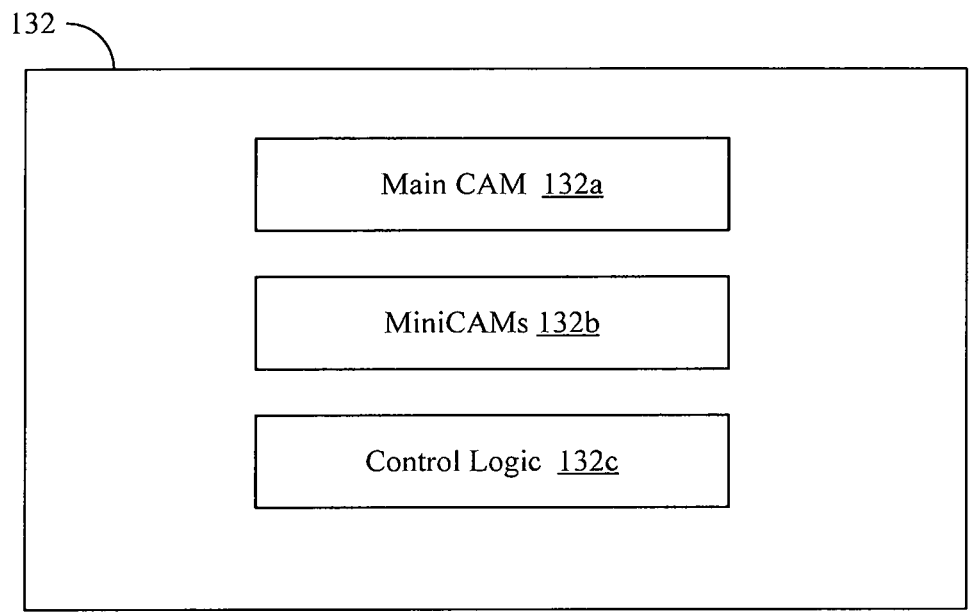
FIGS. 10A and 10B are block diagrams of examples of decompression apparatuses according to embodiments.

FIG. 10A shows a decompression apparatus 132 (132*a*-132*c*) that may implement one or more aspects of the method 30 (FIGS. 3A to 3C), the method 45 (FIG. 4), and/or the process flow 95 (FIG. 8). The decompression apparatus 132, which may include logic instructions, configurable logic, fixed-functionality hardware logic, may be readily substituted for or incorporate aspects of the system 10 (FIG. 1), the apparatus 20 (FIG. 2), the apparatus 70 (FIG. 5), the apparatus 80 (FIG. 6), the miniCAMS 91 and/or 92 (FIGS. 7A to 7B), the apparatus 100 (FIG. 9), already discussed. The apparatus 132 may include a main CAM 132*a*, one or more miniCAMs 132*b*, and a control logic 132*c* to load compressed symbols in a data stream into the main CAM 132*a*, break a serial dependency of the compressed symbols in the compressed data stream, and decode more than one symbol per clock. For example, the control logic 132*c* to break the serial dependency of compressed symbols in the compressed data stream may be based on Huffman speculation.

In some embodiments of the apparatus 132, the control logic 132*c* may be further configured to load a subset of the compressed symbols into the one or more miniCAMs 132*b*. For example, the subset of the compressed symbols loaded into the one or more miniCAMs 132*b* may consist of a subset of the compressed symbols loaded into the main CAM 132*a* having shorter length as compared to other compressed symbols loaded into the main CAM 132*a*. The control logic 132*c* may be further configured to decode the subset of the compressed symbols loaded into the one or more miniCAMs 132*b* in parallel with the compressed symbols loaded into the main CAM 132*a*.

In some embodiments of the apparatus 132, the control logic 132*c* may be additionally or alternatively configured to dynamically partition the one or more miniCAMs 132*b* based on a Huffman code distribution of corresponding literal-length and distance symbols. For example, the control logic 132*c* may be configured to parse Huffman code-lengths for all literal, length and distance symbols in a block from a header of the block, determine minimum and maximum numbers of bits that a Huffman decoder may consume in a clock cycle based on the parsed Huffman code-lengths, and reconfigure one or more payload-shift magnitudes for the one or more miniCAMs 132*b* based on the determined minimum and maximum numbers of bits. In some embodiments, the control logic 132*c* may also be configured to track convergence of real and speculative threads, and generate one of a commit symbol and a flush symbol based on the tracked convergence. The control logic 132*c* may also be configured to evaluate consecutive reference tokens to opportunistically select reference pairs that can be simultaneously written into a history buffer without any internal data dependency.

Figure 10B:
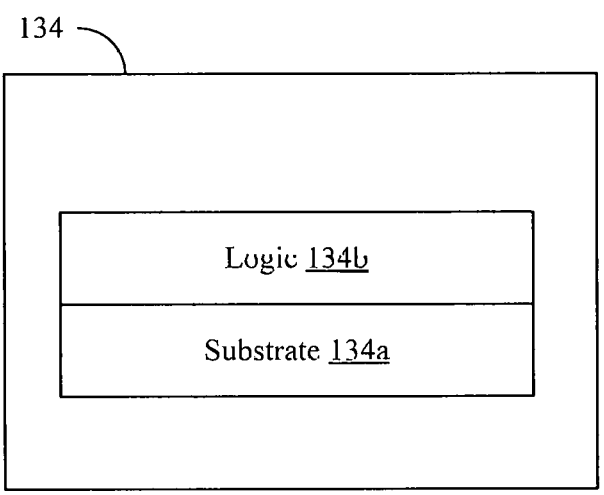

Turning now to FIG. 10B, decompression apparatus 134 (134*a*, 134*b*) is shown in which logic 134*b* (e.g., transistor array and other integrated circuit/IC components) is coupled to a substrate 134*a* (e.g., silicon, sapphire, gallium arsenide). The logic 134*b* may generally implement one or more aspects of the method 30 (FIGS. 3A to 3C), the method 45 (FIG. 4), and/or the process flow 95 (FIG. 8). Thus, the logic 134*b* may load compressed symbols in a data stream into a main CAM, break a serial dependency of the compressed symbols in the compressed data stream, and decode more than one symbol per clock. For example, the logic 134*b* to break the serial dependency of compressed symbols in the compressed data stream may be based on Huffman speculation. In some embodiments, the logic 134*b* may be further configured to load a subset of the compressed symbols into one or more miniCAMs. For example, the subset of the compressed symbols loaded into the one or more miniCAMs may consist of a subset of the compressed symbols loaded into the main CAM having shorter length as compared to other compressed symbols loaded into the main CAM. The logic 134*b* may be further configured to decode the subset of the compressed symbols loaded into the one or more mini-CAMs in parallel with the compressed symbols loaded into the main CAM.

In some embodiments of the apparatus 134, the logic 134*b* may be additionally or alternatively configured to dynamically partition the one or more miniCAMs based on a Huffman code distribution of corresponding literal-length and distance symbols. For example, the logic 134*b* may be configured to parse Huffman code-lengths for all literal, length and distance symbols in a block from a header of the block, determine minimum and maximum numbers of bits that a Huffman decoder may consume in a clock cycle based on the parsed Huffman code-lengths, and reconfigure one or more payload-shift magnitudes for the one or more mini-CAMs based on the determined minimum and maximum numbers of bits. In some embodiments, the logic 134*b* may also be configured to track convergence of real and specu-lative threads, and generate one of a commit symbol and a flush symbol based on the tracked convergence. The logic 134*b* may also be configured to evaluate consecutive reference tokens to opportunistically select reference pairs that can be simultaneously written into a history buffer without any internal data dependency. In one example, the apparatus 134 is a semiconductor die, chip and/or package.

Figure 11:
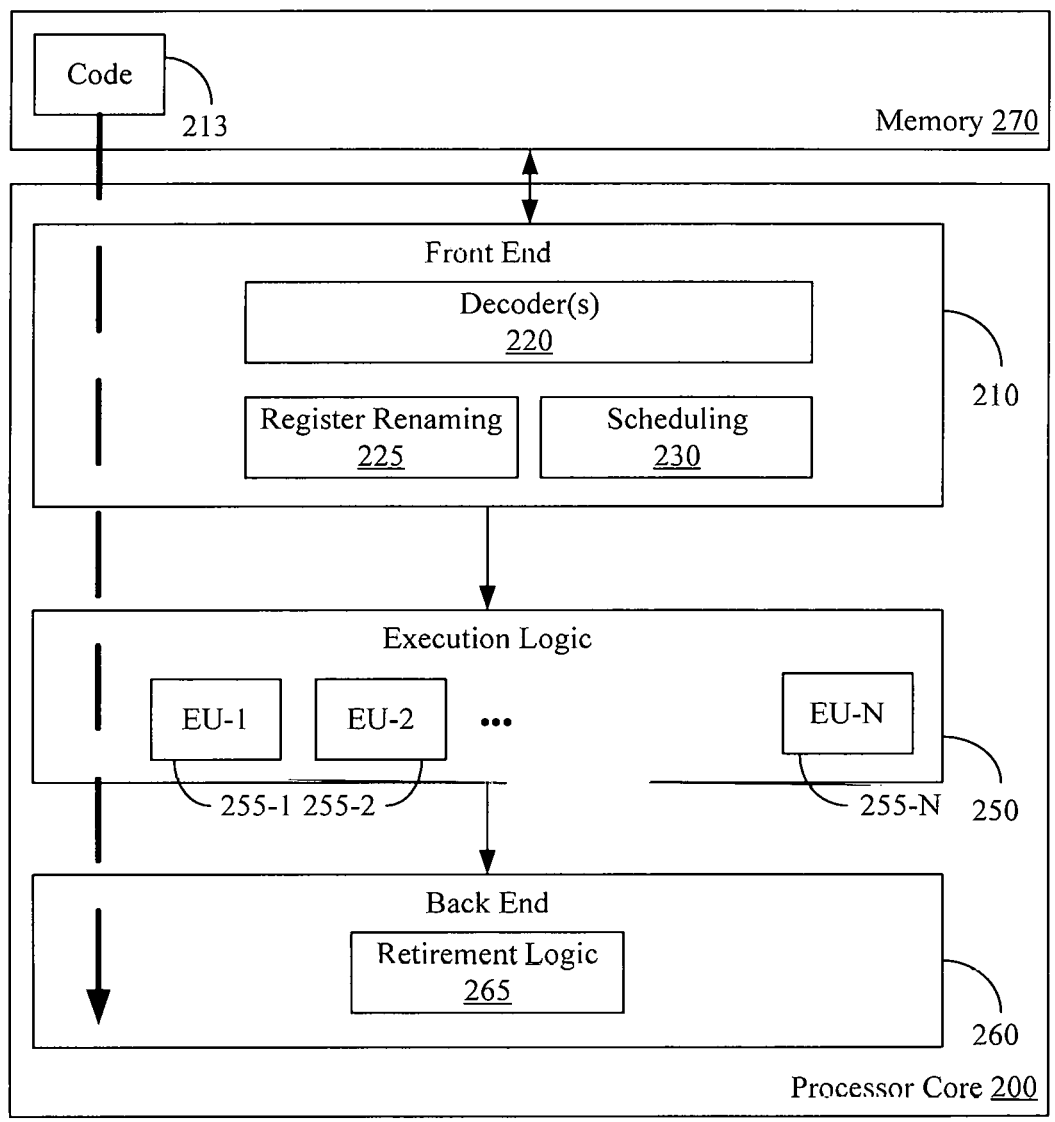
FIG. 11 is a block diagram of an example of a processor according to an embodiment.

FIG. 11 illustrates a processor core 200 according to one embodiment. The processor core 200 may be the core for any type of processor, such as a micro-processor, an embedded processor, a digital signal processor (DSP), a network processor, or other device to execute code. Although only one processor core 200 is illustrated in FIG. 11, a processing element may alternatively include more than one of the processor core 200 illustrated in FIG. 11. The processor core 200 may be a single-threaded core or, for at least one embodiment, the processor core 200 may be multithreaded in that it may include more than one hardware thread context (or "logical processor") per core.

FIG. 11 also illustrates a memory 270 coupled to the processor core 200. The memory 270 may be any of a wide variety of memories (including various layers of memory hierarchy) as are known or otherwise available to those of skill in the art. The memory 270 may include one or more code 213 instruction(s) to be executed by the processor core 200, wherein the code 213 may implement one or more aspects of the method 30 (FIGS. 3A to 3C), the method 45 (FIG. 4), and/or the process flow 95 (FIG. 8), already discussed. The processor core 200 follows a program sequence of instructions indicated by the code 213. Each instruction may enter a front end portion 210 and be processed by one or more decoders 220. The decoder 220 may generate as its output a micro operation such as a fixed width micro operation in a predefined format, or may generate other instructions, microinstructions, or control signals which reflect the original code instruction. The illustrated front end portion 210 also includes register renaming logic 225 and scheduling logic 230, which generally allocate resources and queue the operation corresponding to the convert instruction for execution.

The processor core 200 is shown including execution logic 250 having a set of execution units 255-1 through 255-N. Some embodiments may include a number of execution units dedicated to specific functions or sets of functions. Other embodiments may include only one execution unit or one execution unit that can perform a particular function. The illustrated execution logic 250 performs the operations specified by code instructions.

After completion of execution of the operations specified by the code instructions, back end logic 260 retires the instructions of the code 213. In one embodiment, the processor core 200 allows out of order execution but requires in order retirement of instructions. Retirement logic 265 may take a variety of forms as known to those of skill in the art (e.g., re-order buffers or the like). In this manner, the processor core 200 is transformed during execution of the code 213, at least in terms of the output generated by the decoder, the hardware registers and tables utilized by the register renaming logic 225, and any registers (not shown) modified by the execution logic 250.

Although not illustrated in FIG. 11, a processing element may include other elements on chip with the processor core 200. For example, a processing element may include memory control logic along with the processor core 200. The processing element may include I/O control logic and/or may include I/O control logic integrated with memory control logic. The processing element may also include one or more caches.

Figure 12:
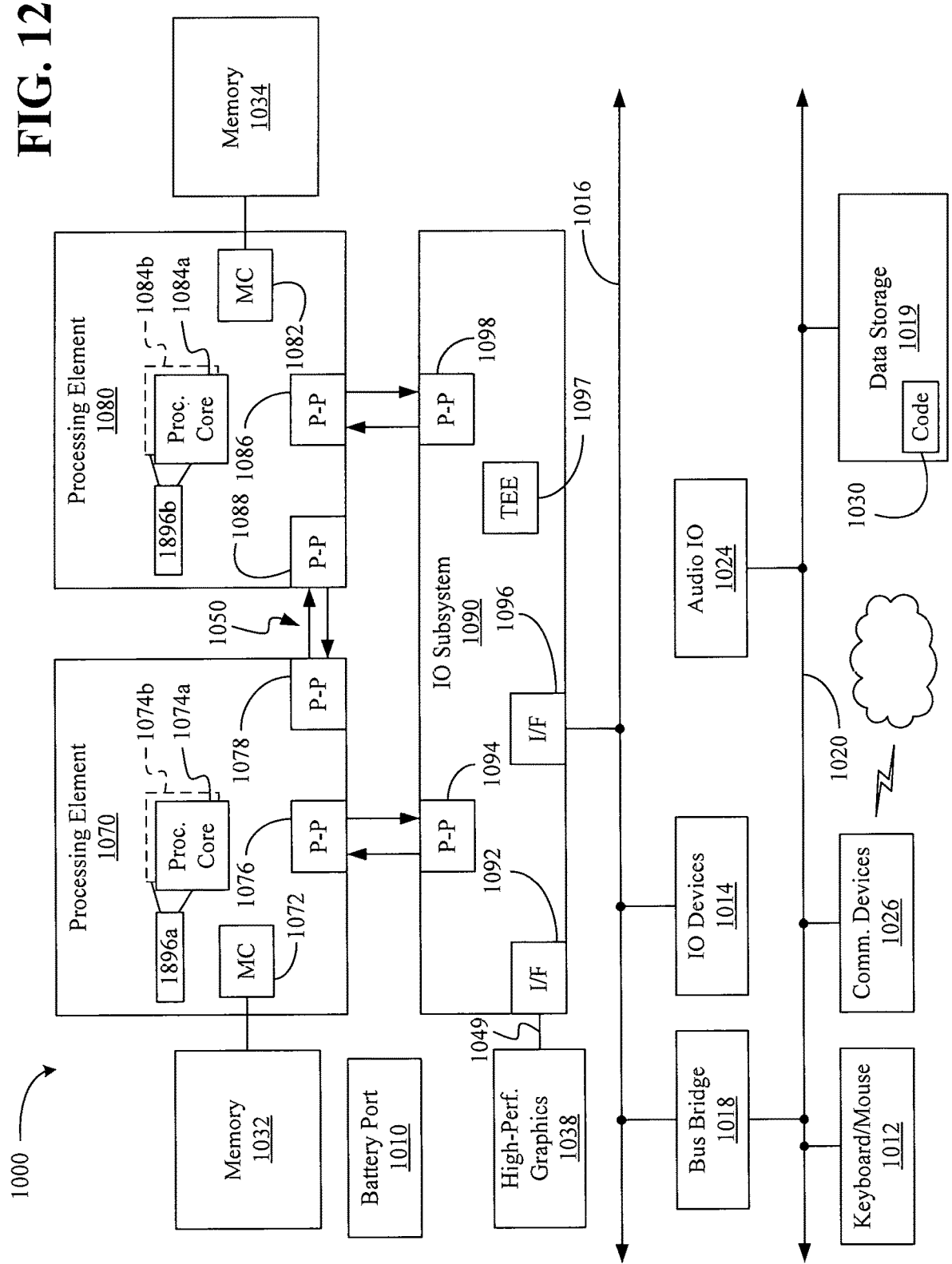
FIG. 12 is a block diagram of an example of a system according to an embodiment.

Referring now to FIG. 12, shown is a block diagram of a system 1000 embodiment in accordance with an embodiment. Shown in FIG. 12 is a multiprocessor system 1000 that includes a first processing element 1070 and a second processing element 1080. While two processing elements 1070 and 1080 are shown, it is to be understood that an embodiment of the system 1000 may also include only one such processing element.

The system 1000 is illustrated as a point-to-point interconnect system, wherein the first processing element 1070 and the second processing element 1080 are coupled via a point-to-point interconnect 1050. It should be understood that any or all of the interconnects illustrated in FIG. 12 may be implemented as a multi-drop bus rather than point-to-point interconnect.

As shown in FIG. 12, each of processing elements 1070 and 1080 may be multicore processors, including first and second processor cores (i.e., processor cores 1074a and 1074b and processor cores 1084a and 1084b). Such cores 1074a, 1074b, 1084a, 1084b may be configured to execute instruction code in a manner similar to that discussed above in connection with FIG. 11.

Each processing element 1070, 1080 may include at least one shared cache 1896a, 1896b (e.g., static random access memory/SRAM). The shared cache 1896a, 1896b may store data (e.g., objects, instructions) that are utilized by one or more components of the processor, such as the cores 1074a, 1074b and 1084a, 1084b, respectively. For example, the shared cache 1896a, 1896b may locally cache data stored in a memory 1032, 1034 for faster access by components of the processor. In one or more embodiments, the shared cache 1896a, 1896b may include one or more mid-level caches, such as level 2 (L2), level 3 (L3), level 4 (L4), or other levels of cache, a last level cache (LLC), and/or combinations thereof.

While shown with only two processing elements 1070, 1080, it is to be understood that the scope of the embodiments are not so limited. In other embodiments, one or more additional processing elements may be present in a given processor. Alternatively, one or more of processing elements 1070, 1080 may be an element other than a processor, such as an accelerator or a field programmable gate array. For example, additional processing element(s) may include additional processors(s) that are the same as a first processor 1070, additional processor(s) that are heterogeneous or asymmetric to processor a first processor 1070, accelerators (such as, e.g., graphics accelerators or digital signal processing (DSP) units), field programmable gate arrays, or any other processing element. There can be a variety of differences between the processing elements 1070, 1080 in terms of a spectrum of metrics of merit including architectural, micro architectural, thermal, power consumption characteristics, and the like. These differences may effectively manifest themselves as asymmetry and heterogeneity amongst the processing elements 1070, 1080. For at least one embodiment, the various processing elements 1070, 1080 may reside in the same die package.

The first processing element 1070 may further include memory controller logic (MC) 1072 and point-to-point (P-P) interfaces 1076 and 1078. Similarly, the second processing element 1080 may include a MC 1082 and P-P interfaces 1086 and 1088. As shown in FIG. 12, MC's 1072 and 1082 couple the processors to respective memories, namely a memory 1032 and a memory 1034, which may be portions of main memory locally attached to the respective processors. While the MC 1072 and 1082 is illustrated as integrated into the processing elements 1070, 1080, for alternative embodiments the MC logic may be discrete logic outside the processing elements 1070, 1080 rather than integrated therein.

The first processing element 1070 and the second processing element 1080 may be coupled to an I/O subsystem 1090 via P-P interconnects 1076 1086, respectively. As shown in FIG. 12, the I/O subsystem 1090 includes a TEE 1097 (e.g., security controller) and P-P interfaces 1094 and 1098. Furthermore, I/O subsystem 1090 includes an interface 1092 to couple I/O subsystem 1090 with a high performance graphics engine 1038. In one embodiment, bus 1049 may be used to couple the graphics engine 1038 to the I/O subsystem 1090. Alternately, a point-to-point interconnect may couple these components.

In turn, I/O subsystem 1090 may be coupled to a first bus 1016 via an interface 1096. In one embodiment, the first bus 1016 may be a Peripheral Component Interconnect (PCI) bus, or a bus such as a PCI Express bus or another third generation I/O interconnect bus, although the scope of the embodiments are not so limited.

As shown in FIG. 12, various I/O devices 1014 (e.g., cameras, sensors) may be coupled to the first bus 1016, along with a bus bridge 1018 which may couple the first bus 1016 to a second bus 1020. In one embodiment, the second bus 1020 may be a low pin count (LPC) bus. Various devices may be coupled to the second bus 1020 including, for example, a keyboard/mouse 1012, network controllers/communication device(s) 1026 (which may in turn be in communication with a computer network), and a data storage unit 1019 such as a disk drive or other mass storage device which may include code 1030, in one embodiment. The code 1030 may include instructions for performing embodiments of one or more of the methods described above. Thus, the illustrated code 1030 may implement one or more aspects of the method 30 (FIGS. 3A to 3C), the method 45 (FIG. 4), and/or the process flow 95 (FIG. 8), already discussed, and may be similar to the code 213 (FIG. 11), already discussed. Further, an audio I/O 1024 may be coupled to second bus 1020.

Note that other embodiments are contemplated. For example, instead of the point-to-point architecture of FIG. 12, a system may implement a multi-drop bus or another such communication topology.

Additional Notes and Examples:

Example 1 may include an electronic decompression system, comprising a first content accessible memory, and logic communicatively coupled to the first content accessible memory to load compressed symbols in a data stream into the first content accessible memory, break a serial dependency of the compressed symbols in the compressed data stream, and decode more than one symbol per clock.

Example 2 may include the system of Example 1, wherein the logic to break the serial dependency of compressed symbols in the compressed data stream is based on Huffman speculation.

Example 3 may include the system of Example 1, further comprising one or more second content accessible memories communicatively coupled to the logic, wherein a capacity of each of the one or more second content accessible memories is less than a capacity of the first content accessible memory, and wherein the logic is further to load a subset of the compressed symbols into the one or more second content accessible memories, and decode the subset of the compressed symbols loaded into the one or more second content accessible memories in parallel with the compressed symbols loaded into the first content accessible memory.

Example 4 may include the system of Example 3, wherein the subset of the compressed symbols loaded into the one or more second content accessible memories consists of a subset of the compressed symbols loaded into the first content accessible memory having shorter length as compared to other compressed symbols loaded into the first content accessible memory.

Example 5 may include the system of Example 3, wherein the logic is further to dynamically partition the one or more second content accessible memories based on a Huffman code distribution of corresponding literal-length and distance symbols.

Example 6 may include the system of Example 5, wherein the logic is further to parse Huffman code-lengths for all literal, length and distance symbols in a block from a header of the block, determine minimum and maximum numbers of bits that a Huffman decoder may consume in a clock cycle based on the parsed Huffman code-lengths, and reconfigure one or more payload-shift magnitudes for the one or more second content accessible memories based on the determined minimum and maximum numbers of bits.

Example 7 may include the system of Example 6, wherein the logic is further to track convergence of real and speculative threads and generate one of a commit symbol and a flush symbol based on the tracked convergence.

Example 8 may include the system of Example 7, further comprising a unified ring buffer communicatively coupled to the logic to self-synchronize contents with a pair of write pointers.

Example 9 may include the system of Example 7, wherein the logic is further to evaluate consecutive reference tokens to opportunistically select reference pairs that can be simultaneously written into a history buffer without any internal data dependency.

Example 10 may include a semiconductor package apparatus, comprising one or more substrates, and logic coupled to the one or more substrates, wherein the logic is at least partly implemented in one or more of configurable logic and fixed-functionality hardware logic, the logic coupled to the one or more substrates to load compressed symbols in a data stream into a first content accessible memory, break a serial dependency of the compressed symbols in the compressed data stream, and decode more than one symbol per clock.

Example 11 may include the apparatus of Example 10, wherein the logic to break the serial dependency of compressed symbols in the compressed data stream is based on Huffman speculation.

Example 12 may include the apparatus of Example 10, wherein the logic is further to load a subset of the compressed symbols into one or more second content accessible memories, wherein the subset of the compressed symbols loaded into the one or more second content accessible memories consists of a subset of the compressed symbols loaded into the first content accessible memory having shorter length as compared to other compressed symbols loaded into the first content accessible memory, and decode the subset of the compressed symbols loaded into the one or more second content accessible memories in parallel with the compressed symbols loaded into the first content accessible memory.

Example 13 may include the apparatus of Example 12, wherein the logic is further to dynamically partition the one or more second content accessible memories based on a Huffman code distribution of corresponding literal-length and distance symbols.

Example 14 may include the apparatus of Example 13, wherein the logic is further to parse Huffman code-lengths for all literal, length and distance symbols in a block from a header of the block, determine minimum and maximum numbers of bits that a Huffman decoder may consume in a clock cycle based on the parsed Huffman code-lengths, and reconfigure one or more payload-shift magnitudes for the one or more second content accessible memories based on the determined minimum and maximum numbers of bits.

Example 15 may include the apparatus of Example 14, wherein the logic is further to track convergence of real and speculative threads and generate one of a commit symbol and a flush symbol based on the tracked convergence.

Example 16 may include the apparatus of Example 15, wherein the logic is further to evaluate consecutive reference tokens to opportunistically select reference pairs that can be simultaneously written into a history buffer without any internal data dependency.

Example 17 may include the apparatus of any of Examples 10 to 16, wherein the logic coupled to the one or more substrates includes transistor channel regions that are positioned within the one or more substrates.

Example 18 may include a method of decompressing data, comprising loading compressed symbols in a data stream into a first content accessible memory, breaking a serial dependency of the compressed symbols in the compressed data stream, and decoding more than one symbol per clock.

Example 19 may include the method of Example 18, further comprising breaking the serial dependency of the compressed symbols in the compressed data stream based on Huffman speculation.

Example 20 may include the method of Example 18, further comprising loading a subset of the compressed symbols into one or more second content accessible memories, and decoding the subset of the compressed symbols loaded into the one or more second content accessible memories in parallel with the compressed symbols loaded into the first content accessible memory.

Example 21 may include the method of Example 20, wherein the subset of the compressed symbols loaded into the one or more second content accessible memories consists of a subset of the compressed symbols loaded into the first content accessible memory having shorter length as compared to other compressed symbols loaded into the first content accessible memory.

Example 22 may include the method of Example 20, further comprising dynamically partitioning the one or more second content accessible memories based on a Huffman code distribution of corresponding literal-length and distance symbols.

Example 23 may include the method of Example 22, further comprising parsing Huffman code-lengths for all literal, length and distance symbols in a block from a header of the block, determining minimum and maximum numbers of bits that a Huffman decoder may consume in a clock cycle based on the parsed Huffman code-lengths, and reconfiguring one or more payload-shift magnitudes for the one or more second content accessible memories based on the determined minimum and maximum numbers of bits.

Example 24 may include the method of Example 23, further comprising tracking convergence of real and speculative threads and generating one of a commit symbol and a flush symbol based on the tracked convergence.

Example 25 may include the method of Example 24, further comprising evaluating consecutive reference tokens to opportunistically select reference pairs that can be simultaneously written into a history buffer without any internal data dependency.

Example 26 may include at least one computer readable storage medium, comprising a set of instructions, which when executed by a computing device, cause the computing device to load compressed symbols in a data stream into a first content accessible memory, break a serial dependency of the compressed symbols in the compressed data stream, and decode more than one symbol per clock.

Example 27 may include the at least one computer readable storage medium of Example 26, comprising a further set of instructions, which when executed by the computing device, cause the computing device to break the serial dependency of the compressed symbols in the compressed data stream based on Huffman speculation.

Example 28 may include the at least one computer readable storage medium of Example 26, comprising a further set of instructions, which when executed by the computing device, cause the computing device to load a subset of the compressed symbols into one or more second content accessible memories, and decode the subset of the compressed symbols loaded into the one or more second content accessible memories in parallel with the compressed symbols loaded into the first content accessible memory.

Example 29 may include the at least one computer readable storage medium of Example 28, wherein the subset of the compressed symbols loaded into the one or more second content accessible memories consists of a subset of the compressed symbols loaded into the first content accessible memory having shorter length as compared to other compressed symbols loaded into the first content accessible memory.

Example 30 may include the at least one computer readable storage medium of Example 28, comprising a further set of instructions, which when executed by the computing device, cause the computing device to dynamically partition the one or more second content accessible memories based on a Huffman code distribution of corresponding literal-length and distance symbols.

Example 31 may include the at least one computer readable storage medium of Example 30, comprising a further set of instructions, which when executed by the computing device, cause the computing device to parse Huffman code-lengths for all literal, length and distance symbols in a block from a header of the block, determine minimum and maximum numbers of bits that a Huffman decoder may consume in a clock cycle based on the parsed Huffman code-lengths, and reconfigure one or more payload-shift magnitudes for the one or more second content accessible memories based on the determined minimum and maximum numbers of bits.

Example 32 may include the at least one computer readable storage medium of Example 31, comprising a further set of instructions, which when executed by the computing device, cause the computing device to track convergence of real and speculative threads and generate one of a commit symbol and a flush symbol based on the tracked convergence.

Example 33 may include the at least one computer readable storage medium of Example 32, comprising a further set of instructions, which when executed by the computing device, cause the computing device to evaluate consecutive reference tokens to opportunistically select reference pairs that can be simultaneously written into a history buffer without any internal data dependency.

Example 34 may include a data decompressing apparatus, comprising means for loading compressed symbols in a data stream into a first content accessible memory, means for breaking a serial dependency of the compressed symbols in the compressed data stream, and means for decoding more than one symbol per clock.

Example 35 may include the apparatus of Example 34, further comprising means for breaking the serial dependency of the compressed symbols in the compressed data stream based on Huffman speculation.

Example 36 may include the apparatus of Example 34, further comprising means for loading a subset of the compressed symbols into one or more second content accessible memories, and means for decoding the subset of the compressed symbols loaded into the one or more second content accessible memories in parallel with the compressed symbols loaded into the first content accessible memory.

Example 37 may include the apparatus of Example 36, wherein the subset of the compressed symbols loaded into the one or more second content accessible memories consists of a subset of the compressed symbols loaded into the first content accessible memory having shorter length as compared to other compressed symbols loaded into the first content accessible memory.

Example 38 may include the apparatus of Example 36, further comprising means for dynamically partitioning the one or more second content accessible memories based on a Huffman code distribution of corresponding literal-length and distance symbols.

Example 39 may include the apparatus of Example 38, further comprising means for parsing Huffman code-lengths for all literal, length and distance symbols in a block from a header of the block, means for determining minimum and maximum numbers of bits that a Huffman decoder may consume in a clock cycle based on the parsed Huffman code-lengths, and means for reconfiguring one or more payload-shift magnitudes for the one or more second content accessible memories based on the determined minimum and maximum numbers of bits.

Example 40 may include the apparatus of Example 39, further comprising means for tracking convergence of real and speculative threads and means for generating one of a commit symbol and a flush symbol based on the tracked convergence.

Example 41 may include the apparatus of Example 40, further comprising means for evaluating consecutive reference tokens to opportunistically select reference pairs that can be simultaneously written into a history buffer without any internal data dependency.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship; direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrase "one or more of A, B, and C" and the phrase "one or more of A, B, or C" both may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. An electronic decompression system, comprising:
a first content accessible memory;
one or more second content accessible memories; and
logic communicatively coupled to the first content accessible memory and the one or more second content accessible memories, wherein the logic is to:
load compressed symbols in a data stream into the first content accessible memory,
break a serial dependency of the compressed symbols in the data stream,
decode more than one symbol per clock,
load a subset of the compressed symbols into the one or more second content accessible memories,
decode the subset of the compressed symbols loaded into the one or more second content accessible memories, and
decode the compressed symbols loaded into the first content accessible memory.

2. The system of claim 1, wherein the logic to break the serial dependency of compressed symbols in the data stream is based on Huffman speculation.

3. The system of claim 1, wherein:
a capacity of each of the one or more second content accessible memories is less than a capacity of the first content accessible memory; and
the logic is further to
decode the subset of the compressed symbols loaded into the one or more second content accessible memories in parallel with the compressed symbols loaded into the first content accessible memory.

4. The system of claim 3, wherein the subset of the compressed symbols loaded into the one or more second content accessible memories consists of a subset of the compressed symbols loaded into the first content accessible memory having shorter length as compared to others of the compressed symbols loaded into the first content accessible memory.

5. The system of claim 3, wherein the logic is further to:
dynamically partition the one or more second content accessible memories based on a Huffman code distribution of corresponding literal-length and distance symbols.

6. The system of claim 5, wherein the logic is further to:
parse Huffman code-lengths for all literal, length and distance symbols in a block from a header of the block;
determine minimum and maximum numbers of bits that a Huffman decoder is to consume in a clock cycle based on the parsed Huffman code-lengths; and
reconfigure one or more payload-shift magnitudes for the one or more second content accessible memories based on the determined minimum and maximum numbers of bits.

7. The system of claim 6, wherein the logic is further to:
track convergence of real and speculative threads; and
generate one of a commit symbol and a flush symbol based on the tracked convergence.

8. The system of claim 7, further comprising:
a unified ring buffer communicatively coupled to the logic to self-synchronize contents with a pair of write pointers.

9. The system of claim 7, wherein the logic is further to:
evaluate consecutive reference tokens to select reference pairs that can be simultaneously written into a history buffer without any internal data dependency.

10. A semiconductor package apparatus, comprising:
one or more substrates; and
logic coupled to the one or more substrates, wherein the logic is at least partly implemented in one or more of configurable logic or fixed-functionality logic hardware, the logic coupled to the one or more substrates to:
load compressed symbols in a data stream into a first content accessible memory,
break a serial dependency of the compressed symbols in the data stream,
decode more than one symbol per clock,
load a subset of the compressed symbols into one or more second content accessible memories,
decode the subset of the compressed symbols loaded into the one or more second content accessible memories, and
decode the compressed symbols loaded into the first content accessible memory.

11. The apparatus of claim 10, wherein the logic to break the serial dependency of compressed symbols in the data stream is based on Huffman speculation.

12. The apparatus of claim 10, wherein the logic is further to:

decode the subset of the compressed symbols loaded into the one or more second content accessible memories in parallel with the compressed symbols loaded into the first content accessible memory, wherein the subset of the compressed symbols loaded into the one or more second content accessible memories consists of a subset of the compressed symbols loaded into the first content accessible memory having shorter length as compared to others of the compressed symbols loaded into the first content accessible memory.

13. The apparatus of claim 12, wherein the logic is further to:

dynamically partition the one or more second content accessible memories based on a Huffman code distribution of corresponding literal-length and distance symbols.

14. The apparatus of claim 13, wherein the logic is further to:

parse Huffman code-lengths for all literal, length and distance symbols in a block from a header of the block;

determine minimum and maximum numbers of bits that a Huffman decoder is to consume in a clock cycle based on the parsed Huffman code-lengths; and reconfigure one or more payload-shift magnitudes for the one or more second content accessible memories based on the determined minimum and maximum numbers of bits.

15. The apparatus of claim 14, wherein the logic is further to:

track convergence of real and speculative threads; and generate one of a commit symbol and a flush symbol based on the tracked convergence.

16. The apparatus of claim 15, wherein the logic is further to:

evaluate consecutive reference tokens to select reference pairs that can be simultaneously written into a history buffer without any internal data dependency.

17. The apparatus of claim 10, wherein the logic coupled to the one or more substrates includes transistor channel regions that are positioned within the one or more substrates.

18. A method of decompressing data, comprising:

loading compressed symbols in a data stream into a first content accessible memory;

breaking a serial dependency of the compressed symbols in the data stream;

decoding more than one symbol per clock;

loading a subset of the compressed symbols into one or more second content accessible memories;

decoding the subset of the compressed symbols loaded into the one or more second content accessible memories; and decoding the compressed symbols loaded into the first content accessible memory.

19. The method of claim 18, further comprising:

breaking the serial dependency of the compressed symbols in the data stream based on Huffman speculation.

20. The method of claim 18, further comprising:

decoding the subset of the compressed symbols loaded into the one or more second content accessible memories in parallel with the compressed symbols loaded into the first content accessible memory.

21. The method of claim 20, wherein the subset of the compressed symbols loaded into the one or more second content accessible memories consists of a subset of the compressed symbols loaded into the first content accessible memory having shorter length as compared to other compressed symbols loaded into the first content accessible memory.

22. The method of claim 20, further comprising:

dynamically partitioning the one or more second content accessible memories based on a Huffman code distribution of corresponding literal-length and distance symbols.

23. The method of claim 22, further comprising:

parsing Huffman code-lengths for all literal, length and distance symbols in a block from a header of the block;

determining minimum and maximum numbers of bits that a Huffman decoder is to consume in a clock cycle based on the parsed Huffman code-lengths; and reconfiguring one or more payload-shift magnitudes for the one or more second content accessible memories based on the determined minimum and maximum numbers of bits.

24. The method of claim 23, further comprising:

tracking convergence of real and speculative threads; and generating one of a commit symbol and a flush symbol based on the tracked convergence.

25. The method of claim 24, further comprising:

evaluating consecutive reference tokens to select reference pairs that can be simultaneously written into a history buffer without any internal data dependency.

\* \* \* \* \*